United States Patent
Kozlowski et al.

(10) Patent No.: US 6,587,142 B1
(45) Date of Patent: *Jul. 1, 2003

(54) LOW-NOISE ACTIVE-PIXEL SENSOR FOR IMAGING ARRAYS WITH HIGH SPEED ROW RESET

(75) Inventors: Lester J. Kozlowski, Semi Valley, CA (US); David L. Standley, Westlake Village, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/164,923

(22) Filed: Oct. 1, 1998

Related U.S. Application Data (63) Continuation-in-part of application No. 09/149,937, filed on Sep. 9, 1998.

(51) Int. Cl.[7] .................. H04N 5/217; H04N 5/335; H01L 27/00; H01L 29/768
(52) U.S. Cl. .................. 348/241; 348/300; 250/208.1; 257/223
(58) Field of Search .................. 348/241, 300, 348/302, 307, 308, 309, 310; 250/208.1; 257/223; 327/522

(56) References Cited

U.S. PATENT DOCUMENTS

| | | |
|---|---|---|
| 4,249,122 A | 2/1981 | Widlar |
| 4,463,383 A | 7/1984 | Sonoda et al. |
| 4,466,018 A | 8/1984 | Sonoda et al. |
| 4,676,761 A | 6/1987 | Poujois |
| 4,794,247 A | 12/1988 | Stineman, Jr. |
| 5,043,820 A | 8/1991 | Wyles et al. |
| 5,083,016 A | 1/1992 | Wyles et al. |
| 5,296,696 A | 3/1994 | Uno |

(List continued on next page.)

FOREIGN PATENT DOCUMENTS

| | | | |
|---|---|---|---|
| DE | 19533061 | 3/1997 | |
| EP | 0905788 A2 * | 3/1999 | ......... H01L/27/146 |
| JP | 63036612 A * | 2/1988 | ......... H03K/17/78 |
| JP | 04345261 | 12/1992 | |
| JP | 04345261 A * | 12/1992 | ......... H04N/1/028 |
| WO | WO 9641464 | 12/1996 | |

OTHER PUBLICATIONS

R.H. Dyck and G.P. Weckler; "Integrated arrays of silicon photodetectors for image sensing," IEEE Trans. Electron Devices, ED-15, Apr. 1968, pp. 196-201.

J.D. Plummer and J.D. Meindl, "MOS electronics for a portable reading aid for the blind," IEEE J. Solid-State Circuits, SC-7, Apr. 1972, pp. 111-119.

N. Koike, I. Takemoto, K. Satoh, S. Hanamura, S. Nagahara and M. Kubo, "MOS Area Sensor: Part I—Design consideration and performance of an n–p–n Structure 484 x 384 element color MOS Imager," IEEE Trans. Electron Devices, ED-27 (8), Aug. 1980, pp. 1676-1681.

(List continued on next page.)

*Primary Examiner*—Wendy R. Garber
*Assistant Examiner*—John M. Villecco
(74) *Attorney, Agent, or Firm*—Christopher J. Rourk; Akin Gump Strauss Hauer & Feld, LLP

(57) ABSTRACT

An active pixel sensor circuit including a photodetector, a first MOS transistor functioning as the driver of a source follower amplifier during signal readout, a second MOS transistor serving as a pixel readout transistor, a third MOS transistor serving as a photodetector reset transistor, and a reset noise cancellation circuit including a fourth MOS transistor, first and second capacitances, and an amplifier having a gain which is a specified multiple of the ratio of the first to the second capacitance. The first capacitance is connected in parallel to the photodector. The amplifier reduces the reset noise caused by resetting the photodector without having to implement correlated double sampling.

30 Claims, 4 Drawing Sheets

U.S. PATENT DOCUMENTS

| | | | |
|---|---|---|---|
| 5,345,266 A | | 9/1994 | Denyer |
| 5,357,129 A | * | 10/1994 | Kamimura .................. 257/223 |
| RE34,908 E | | 4/1995 | Wyles et al. |
| 5,471,515 A | | 11/1995 | Fossum |
| 5,541,402 A | | 7/1996 | Ackland et al. |
| 5,576,763 A | | 11/1996 | Ackland et al. |
| 5,587,596 A | | 12/1996 | Chi et al. |
| 5,608,243 A | | 3/1997 | Chi et al. |
| 5,650,643 A | * | 7/1997 | Konuma ..................... 257/222 |
| 5,654,755 A | * | 8/1997 | Hosier ........................ 348/244 |
| 5,708,263 A | * | 1/1998 | Wong ...................... 250/208.1 |
| 5,831,258 A | * | 11/1998 | Street ....................... 250/208.1 |
| 5,892,540 A | * | 4/1999 | Kozlowski et al. ...... 250/208.1 |
| 5,936,866 A | * | 8/1999 | Seitz et al. ................. 250/200 |
| 6,040,593 A | * | 3/2000 | Park ........................... 257/233 |
| 6,091,280 A | * | 7/2000 | Hynecek ..................... 250/200 |
| 6,111,606 A | * | 8/2000 | Ikeda ......................... 327/552 |
| 6,160,282 A | * | 12/2000 | Merrill ....................... 257/292 |
| 6,194,696 B1 | * | 2/2001 | Fossum et al. ........... 250/208.1 |
| 6,300,978 B1 | * | 10/2001 | Matsunaga et al. ......... 257/291 |
| 6,317,154 B2 | * | 11/2001 | Beiley ..................... 250/208.1 |
| 6,320,616 B1 | * | 11/2001 | Sauer ..................... 250/208.1 |

OTHER PUBLICATIONS

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor withi Anti–blooming Photodiodes," IEEE Trans. Electron Devices, ED–27 (8), Aug. 1980, pp. 1682–1687.

EG&G Reticon Sales Catalog, *Image Sensing and Solid State Camera Products 1994/1995*. Solid State Image Sensor Array Specifications for Part Numbers: RA2568N, RA0100A/RA0128N and RA0256B.

H. Ando, S. Ohba, M. Nakai, T. Ozaki, M. Ozawa, K. Ikeda, T. Masuhara, T. Imaide, I. Takemoto, T. Suzuki and T. Fujita, "Design Consideration and Performance of a New MOS Imaging Device," IEEE Trans. On Elec. Dev., ED–32 (8), Aug. 1985, pp. 1484–1489.

N. Tanaka, T. Ohmi and Y. Nakamura, "A Novel Bipolar Imaging Device with Self–Noise–Reduction Capability," IEEE Trans Elec. Dev., 36 (1), Jan. 1989, pp. 31–38.

G.P. Weckler, "Storage Mode Operation of a Phototransistor and its Adaptation to Integrated Arrays for Image Detection," IEDM, Oct. 1966. . (Abstract only) No known paper available from professional document delivery services.

N. Tanaka, T. Ohmi, Y. Nakamura and S.Matsumoto, "A Low–Noise Bi–CMOS Linear Imager Sensor with Auto–Focusing Fucntion," IEEE Trans Elec. Dev., 36 (1), Jan. 1989, pp. 39–45.

N. Tanaka, S. Hashimoto, M. Shinohara, S. Sugawa, M. Morishita, S. Matsumora, Y. Nakamura and T. Ohmi, A 310k Pixel Bipolar Imager (BASIS), ISSCC 1989.

G. P. Weckler, "Charge Storage Lights the Way for Solid––State Image Sensors", Electronics, May 1, 1967, pp. 75–78.

G.P. Weckler, "Operation of p–n Junction Photodetectors in a Photon Flux Integrated Mode", IEEE Journal of Solid State Circuits, vol. SC–2, No. 3, Sep. 1967, pp. 65–73.

G.P. Weckler and R.H. Dyck, "Integrated Arrays of Silicon Photodetectors for Image Sensing", WESCON, Aug. 22–25, 1967, pp. 1–8.

L.J. Kozlowski, J. Luo, W.E. Kleinhans and T. Liu, "Comparison of Passive and Active Pixel Schemes for CMOS Visible Imagers", SPIE, vol. 3360, Apr. 1998.

Ming–Jer Chin, Yen–Bin Gu, Terry Wu, Po–Chin Hsu, and Tsung–Hann Liu, "Weak Inversion Charge Injection in Analog Mos Switches", IEEE Journal of Solid–State Circuits, vol. 30, No. 5, May 1995, pp. 604–606.

Peter W. Pry, Peter J.W. Noble and Rober J. Rycroft, "Fixed–Pattern Noise in Photomatrices", IEEE Journal of Solid–State Cirucits, vol. SC–5, No. 5, Oct. 1970, pp. 250–254.

Degrauwe et al., "A Micropower CMOS–Instrumentation Amplifier", IEEE Journal of Solid–State Circuits, vol. SC–20, No. 3, Jun. 1985, pp. 805–807.

Letter dated Jul. 31, 1998, from Gene Weckler, RAD–ICON Imaging Corp., addressed to Mark Wettler.

* cited by examiner

LOW-NOISE ACTIVE-PIXEL SENSOR FOR IMAGING ARRAYS WITH HIGH SPEED ROW RESET

RELATED APPLICATIONS

This application is a continuation-in-part application of U.S. Ser. No. 09/149,937 filed on Sep. 9, 1998.

BACKGROUND OF THE INVENTION

1. Field of the Invention

The present invention relates to electronic imaging devices and, in particular, to low-noise MOS-based imagers having minimal analog components in each pixel. The invention provides both a method and apparatus for significantly improving cancellation of reset noise in an MOS active pixel sensor (APS).

2. Description of Related Art

The prior art describes many alternatives to CCD sensors for generating video or still images. The various schemes can be grouped into two basic classes, depending upon whether signal amplification is performed at each pixel or in support circuits. In the passive-pixel sensor, pixel simplicity and optical fill factor are maximized. Active-pixel sensors (APS's) include an amplifier at each pixel site to instead optimize signal transfer and sensitivity.

The simplest passive pixel comprises a photodiode and an access transistor wherein the photo-generated charge is passively transferred from each pixel to downstream circuits. The integrated charge must, however, be efficiently transferred with low noise and low nonuniformity. Since each column of pixels often shares a common row or column bus for reading the signal, noise and nonuniformity suppression are typically facilitated in the "column" buffer servicing each bus. In U.S. Pat. No. 5,043,820, Wyles teaches using a buffer amplifier with capacitive feedback to yield reasonable sensitivity considering the large bus capacitance. Since such charge-amplification means were not generally practical for on-chip implementation in early MOS imaging sensors, alternative means compatible with NMOS technology were used. One approach which as mass-produced by Hitachi for camcorders is described in "MOS Area Sensor, etc . . . " Parts I and II" in *IEEE Trans. Electron Devices*, ED-27 (8), August, 1980, pp. 1676–1687. The key refinements with respect to the transimpedance amplifier include antiblooming control and circuitry for reducing fixed pattern noise. Though these imagers were inferior to the emerging charge coupled device (CCD) imagers available at the time, similar MOS imagers are still being offered commercially.

Subsequent efforts at improving passive-pixel imager performance have also focused on column buffer enhancements. One improvement to the column buffer involved using an enhancement/depletion inverter amplifier to provide reasonably large amplification in a small amount of real estate; its 40 lux (lx) sensitivity was nevertheless nearly an order of magnitude below that of competing CCD-based sensors. Another improvement both enhanced sensitivity and facilitated automatic gain control via charge amplification in the column buffer. Recently, those working in the art have revisited the original capacitive-feedback transimpedance amplifier (CTIA) concept because the CTIA appears to the inventors to be nearly ideal for passive-pixel readout if issues with temporal noise pickup and fixed-pattern noise are adequately addressed.

Though much progress has been made in developing passive-pixel imagers, their temporal S/N performance is fundamentally inferior to competing CCD imagers because the bus capacitance translates to read noise of ≈100 e–. CCDs, on the other hand, typically have read noise of 20 to 40 e– at video frame rates. Nevertheless, the allure of producing imagers in conventional MOS fabrication technologies rather than esoteric CCD processes (which usually require many implantation steps and complex interface circuitry in the camera) has encouraged the development of active-pixel sensors that can better compete with CCDs.

It appears to the inventors that the first step in such development is to mitigate the noise associated with the bus capacitance. One approach has been to add amplification to the pixel via the phototransistor by means of a Base-Stored Image Sensor (BASIS) which uses a bipolar transistor in emitter follower configuration together with a downstream correlated double sampler to suppress random and temporal noise. By storing the photogenerated-signal on the phototransistor's base to provide charge amplification, the minimum scene illumination was reportedly reduced to $10^{-3}$ lx in a linear sensor array. However, the minimum scene illumination was higher ($10^{-2}$ lx) in a two-dimensional BASIS imager having 310,000 pixels because the photoresponse nonuniformity was relatively high ($\leq 2\%$). These MOS imagers had adequate sensitivity, but their pixel pitch was too large at about 13 $\mu$m. It has thus appeared desirable to the inventors to shrink the pixel pitch while also reducing photoresponse nonuniformity.

Since the incorporation of bipolar phototransistors is not strictly compatible with mainstream CMOS processes, others have segregated photodetection and signal amplification in an active-pixel sensor essentially comprising a three-transistor pixel with photodiode. All such proposals still offer inadequate performance. One approach discussed in U.S. Pat. No. 5,296,696, for example, augments the basic source-follower configuration with a column buffer that cancels fixed pattern noise, but adds a fourth transistor in a manner that creates a floating node vulnerable to generation of random offsets from charge-pumping and concomitant charge redistribution. U.S. Pat. No. 5,043,820 offers a method for injecting charge to reduce offset errors, but not with adequate accuracy and resolution to be useful for competing with CCDs. Furthermore, these and other similar approaches which require 3–4 transistors in the pixel (at least one of which is relatively large to minimize amplifier l/f noise) in addition to the photodiode, also require off-chip signal processing for best S/N performance because none addresses the dominant source of temporal noise, namely the reset or "KTC" noise.

In order to eliminate or greatly suppress the reset (kTC) noise generated by resetting the detector capacitance, a dedicated memory element is usually needed, either on-chip or off-chip, to store the reset voltage to apply correlated double sampling by coherently subtracting the stored correlated reset noise while each pixel's photo-generated voltage is being read. U.S. Pat. No. 5,471,515 subsequently addressed this basic deficiency by developing an APS that uses intra-pixel charge transfer to store the reset charge at each pixel at the start of each imaging frame. This floating gate APS facilitates correlated double sampling with high efficiency by adding several transistors and relying on a photogate for signal detection.

As those skilled in the art will appreciate, in conventional correlated double sampling (CDS) the reset noise is sampled, stored and later subtracted from the composite signal level. Both temporal and spatial noise are reduced since the reset noise is correlated within each frame. CDS, however, requires a storage means for each pixel that resides either on- or off-chip. Adding the memory element to each pixel compromises the pixel optical fill factor or often requires circuit elements not strictly compatible with standard CMOS processes. One alternative—adding the memory cell to the integrated circuit—greatly adds to the chip area and associated fabrication cost or increases vulnerability to blooming and lag. A second alternative—providing the memory in support electronics—requires both full frame memory to store the reset levels on a frame-by-frame basis and signal processing electronics to digitally subtract the stored reset values.

The drawbacks of various prior art approaches are intractable because they increase imager cost. For example, the '515 patent approach adds several transistors to each pixel and several million transistors to each imager thereby reducing production yield. The BASIS apparatus employing bipolar transistors is not compatible with standard CMOS gate fabrication so a nonstandard process must be developed. These deficiencies were subsequently addressed by Ackland U.S. Pat. Nos. 5,576,763 and 5,541,402; and by Chi in U.S. Pat. Nos. 5,587,596 and 5,608,243. Ackland addresses the image lag issues associated with the intra-pixel charge transfer means but still requires a non-standard CMOS process. Chi reduces pixel complexity at the expense of reset noise by instead using the simplest possible active pixel comprising only a phototransistor and reset MOSFET. Chi's implementation incurs reset noise and compromises spectral response at longer wavelengths by putting the photodiode in an n-well.

SUMMARY OF THE INVENTION

The invention facilitates creation of an improved electronic imaging system and also provides an improved method and apparatus for canceling reset noise in an APS. A key feature of the invention is an integrated low-noise amplifier that provides low temporal and fixed pattern noise while simultaneously providing reasonably high optical fill factor in mature, cost-effective CMOS processes. Application of the invention facilitates construction of a video camera that can be configured as a single CMOS integrated circuit supported by only an oscillator and a battery.

Important aspects of the present invention are an improved active pixel sensor, as well as a low-noise imaging system for implementation in CMOS or in other semiconductor fabrication technologies. The low-noise amplifier system minimizes the reset noise generated by resetting the integration capacitance via a novel active pixel sensor (APS) implementation that is capable of reasonably high optical collection efficiency in $\leq 0.5$ $\mu$m CMOS. The lower noise of the active pixel sensor significantly increases the maximum attainable on-chip signal-to-noise ratio relative to the current state-of-the-art. Many current systems require either expensive off-chip memory and signal processing or alternative APS schemes which attempt to mimic charge-coupled device technology to achieve low noise. The latter schemes are typically not directly manufacturable using standard CMOS processes. The present invention can be readily manufactured in conventional CMOS processes available at many production foundries.

The new active-pixel sensor comprises a photodetector and four transistors to eliminate the reset noise which otherwise occurs. Three of the transistors can be sized using the minimum possible dimensions set by the lithography to maximize the collection area of the phototransistor. The invention obviates the otherwise ubiquitous need for conventional correlated double sampling (CDS) by effectively constructing an active-pixel comprising a photodiode, two capacitors and four transistors.

To minimize total cost and the signal processing burden for the downstream electronics while also facilitating the production of low-noise CMOS imagers with reasonably high optical fill factor and low noise, the inventors add a fourth transistor to the basic three transistor CMOS active pixel sensor to null the reset noise. Via a straightforward layout, the fourth transistor facilitates the addition of a relatively small storage capacitor, $C_{store}$, adjacent to the photodiode and a small capacitance, $C_{fb}$, to couple the storage node to the photodiode. The small capacitive coupling provides a linear attenuation in which the programming waveform actively modifies the photodiode voltage to cancel the reset noise. Just after each pixel is reset, a feedback amplifier servicing the pixel and having a gain equal to a specified multiple of the linear attenuation factor, nulls out the noise (both temporal and FPN), and the storage capacitor is then latched. Upon readout of the photogenerated signal after the prescribed signal integration time, the "raw" output is thus devoid of a substantial portion of the reset noise. This technique does not suffer the bandwidth limitations of other feedback-based schemes and is therefore compatible with higher row reset rates for video rate imaging of large format imagers. Also, it does not require additional memory to store each pixel's offset voltage.

The four transistor APS of the present invention comprises a first transistor that functions as the driver of a source follower amplifier during signal readout, a second transistor which facilitates signal readout, a third transistor which serves as a reset switch and a fourth transistor to cancel the reset noise. The reset and read operations are appropriately facilitated by on-chip digital clocking logic that reads the signal from each pixel, multiplexes the signal outputs from an array of pixels, resets the pixels, and enables the array of feedback loops to cancel the imager's reset noise on a pixel-by-pixel basis. In the typical two-dimensional array, the multiplexing is performed, as in the prior art, by horizontal and vertical shift registers. Just after all the active pixels in a row (in a one- or two-dimensional imaging array) are reset on a row-by-row basis, each column buffer cancels the selected pixel's reset noise by appropriately modifying the photodiode voltage at the start of the integration cycle.

For a visible imager APS design, one additional transistor is needed in each pixel as compared to the basic three-transistor APS design. This requirement compromises the optical fill factor, but to a much smaller degree than if an optimally sized CDS capacitor were used instead. In addition, since the gate-to-source capacitance of the nulling "fourth" transistor is used, and since this capacitance is formed by increasing the gate-to-source overlap via the thin gate oxide, the necessary real estate is small. The required area is further reduced as compared to that required for an optimally-sized CDS capacitor. While storing a voltage on the coupling capacitor also generates a reset noise, this reset noise is effectively reduce d by the feedback amplifier's gain and the attenuation of the path from the storage node to the photodiode node. The feedback gain is nominally set to some multiple k of the reciprocal of the attenuation factor, i.e.:

$$A_V \approx \frac{C_{pd}}{C_{fb}}(k)$$

The present invention also eliminates feedthrough-induced offsets stemming from charge pumping. Applying feedback via the column buffer suppresses reset noise without having to implement correlated double sampling via on-chip or off-chip memory.

The low noise amplifier system of the present invention is formed by the aggregate circuitry in each pixel, and the waveform generation circuits and column buffers servicing that column or row of pixels. The signals from the active pixels are read out by the low-noise signal amplification system consisting of the active-pixel, the waveform generators and the column buffer. In addition to providing the means for suppressing the detector's reset noise, the column buffer in the downstream electronics also may perform other typical functions, some of which are optional, including sample-and-hold, video pipelining, and column amplifier offset cancellation to suppress the temporal and spatial noise that would otherwise be generated by the column buffer.

The low-noise system provides the following key functions: (1) reset noise suppression using space-efficient analog memory in each pixel to facilitate reset noise suppression; (2) high sensitivity via source follower amplification; (3) adequate power supply rejection to enable development of cameras-on-a-chip that do not require elaborate support electronics; (4) compatibility with application to imaging arrays having pixel pitch less than 5 microns when using 0.25 µm lithography; and (5) enables reasonable optical fill factors using lower cost 0.5 µm lithography at 5 µm pixel pitch.

The invention has the advantage of full process compatibility with standard silicided submicron CMOS, helps to maximize yield and minimize die cost because the circuit complexity is distributed among the active-pixels and peripheral circuits, and exploits the signal processing capability inherent to CMOS. The invention's spectral response is broad from the near-ultraviolet (400 nm) to the near-IR (>800 nm).

Because the low-noise system of the present invention uses four MOSFETs, three of which are nearly minimum size, the invention offers as-drawn optical fill factor of approximately 12% at 7 µm pixel pitch using 0.5 µm design rules in the single-poly, three-metal CMOS available from many foundries. The actual optical fill factor is somewhat larger due to lateral collection and the large carrier diffusion length of commercial CMOS processes. Migrating the scheme to 0.25 µm rules increases the fill factor to above 40%. A final advantage is the flexibility to collocate digital logic and signal-processing circuits due to the invention's immunity to electromagnetic interference.

When fully implemented in the desired camera-on-a-chip architecture, the low-noise APS with fast reset can provide temporal read noise<15 e– at data rates compatible with either high frame rate video imaging or still photography via electronic means. It is also capable of minimizing fixed pattern noise to below 0.01% of the maximum signal (on a par with competing CCD imagers), <0.5% nonlinearity, ~1V signal swing for 3.3V power supply, large charge-handling capacity, and variable sensitivity using simple serial interface updated on a frame-by-frame basis via digital interface to a host microprocessor.

BRIEF DESCRIPTION OF THE DRAWINGS

The just described invention, as well as its objects and advantages, will become readily apparent upon reference to the following detailed description when considered in conjunction with the accompanying drawings, in which like reference numerals designate like parts throughout the Figures thereof, and wherein.

DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art.

Visible imaging systems implemented in CMOS have the potential for significant reductions in cost and power requirements in components such as image sensors, drive electronics, and output signal conditioning electronics. An objective is a video camera that can be configured as a single CMOS integrated circuit supported by only an oscillator and a battery. Such a CMOS imaging system requires lower voltages and dissipates much less power than a CCD-based system. These improvements translate into smaller camera size, longer battery life, and applicability to many new products.

Because of the advantages offered by CMOS visible imagers, there have been ongoing efforts to develop active-pixel sensor (APS) devices. Active-pixel sensors can provide low read noise comparable or superior to scientific grade CCD systems. The active circuit in each pixel of an APS device, however, utilizes cell "real estate" that could otherwise be used to enable imagers having optical format compatible with standard lenses and/or to maximize the sensor optical fill factor for high sensitivity. Active-pixel circuits also may increase power dissipation relative to passive-pixel alternatives, increase fixed pattern noise (possibly requiring additional circuitry to suppress the noise), and limit the scalability of the technology.

The CMOS readout and amplification system provided according to the present invention is directly applicable to a practical design for an active-pixel array. A representative embodiment of the low-noise APS invention is configurable, for example, as a visible imager comprising an array of 1032 (columns) by 776 (rows) of visible light detectors (photodetectors). Using standard 0.5 µm design rules, the rows and columns of pixel can be spaced at 7 microns center-to-center to achieve an as-drawn optical fill factor of 12%. Adding microlenses over the optically active area increases the effective fill factor to over 50%. Other conceptual computer-aided design (CAD) layouts using 0.25 µm rules imply that the scheme provides as-drawn optical fill factor of >50% at a highly desirable pitch of 5.6 µm. Several columns and rows of detectors at the perimeter of the light-sensitive region can be covered with metal to establish the dark level for various signal processing functions including automatic gain control. In addition, the detectors in each row can be covered with color filters to produce color imagers. For example, the odd rows may begin at the left with red, green, then blue filters, and the even rows may begin with blue, red, then green filters, with these patterns repeating to fill the respective rows.

Figure 1:
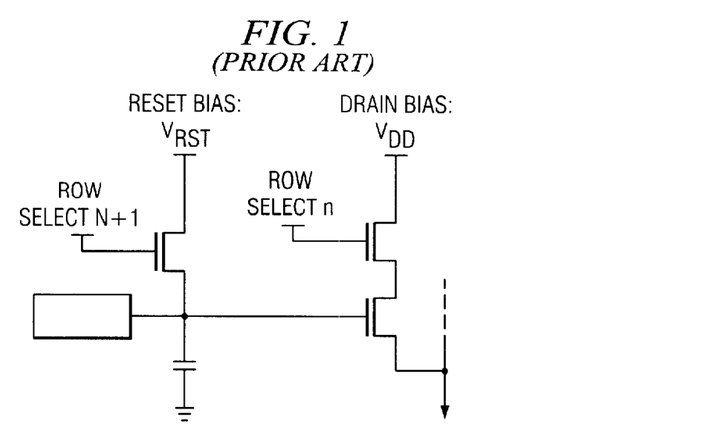
FIG. 1 is a schematic circuit diagram illustrating an amplifier system comprising a source follower per detector used in active-pixel imaging sensors of the prior art.
Figure 2:
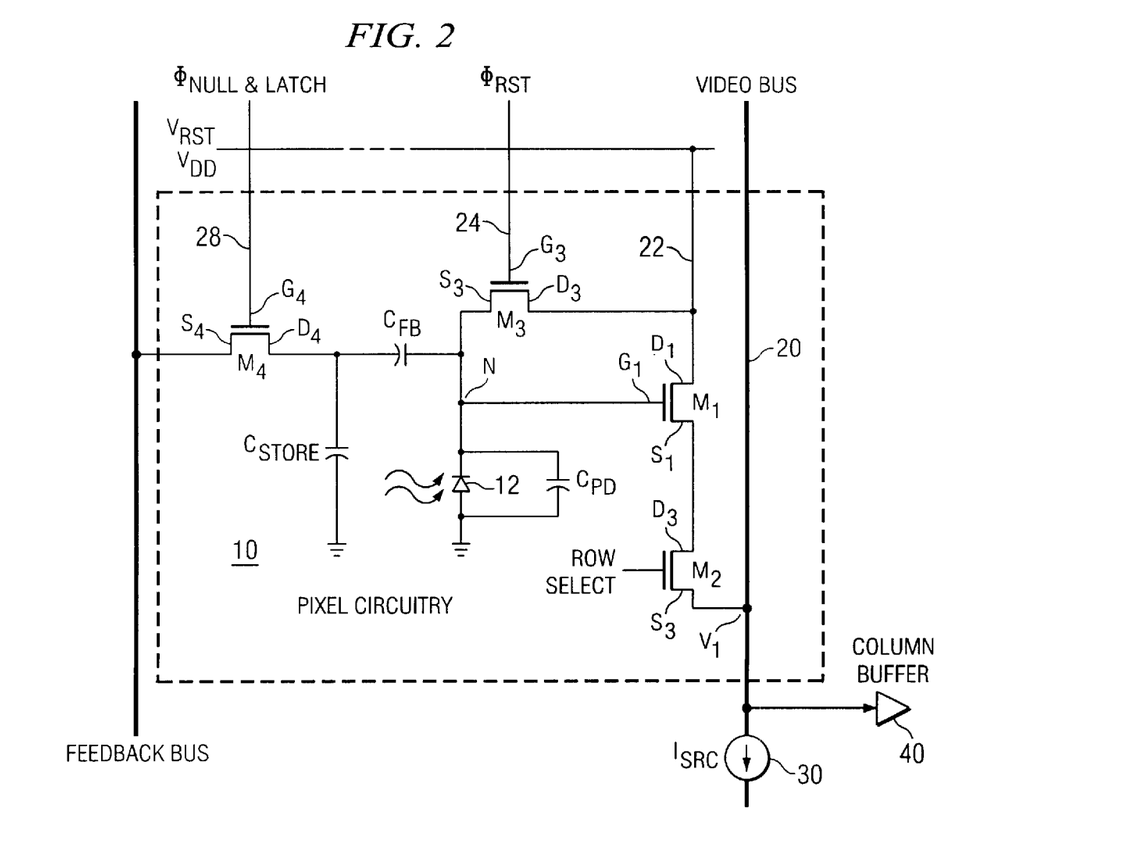
FIG. 2 is a schematic circuit diagram illustrating the low-noise active-pixel of the preferred embodiment of the present invention.

A low-noise active-pixel sensor 10 according to the preferred embodiment of the present invention is illustrated in the schematic diagram of FIG. 2. In the preferred embodiment, each pixel 10 of the sensor array includes a photodetector, such as a photodiode 12. The cathode or node N of the photodiode 12 connects to the gate $G_1$ of a driver MOSFET M1, the source $S_3$ of a reset MOSFET M3 and one side of a coupling capacitor $C_{fb}$. The second side of the coupling capacitor $C_{fb}$ connects to one side of a storage capacitor $C_{store}$, and to the drain $D_4$ of the MOSFET M4. The gate $G_4$ of the MOSFET M4 connects to a feedback bus 28. A video bus 20 connects all the pixel outputs $V_1 \ldots V_n$ in a column of the photodetector array, via a respective pixel enable MOSFET M2, to a common current source 30 and a column buffer 40. A row or column bus 22 connects the drain $D_1$ of the first MOSFET M1 of each pixel 10 in a column to the power supply voltage $V_{DD}$ and reset voltage $V_{rst}$. A row or column bus 24 connects the gate $G_3$ of each MOSFET M3 of each pixel 10 in a column to the reset clock, $\Phi_{rst}$. A row bus 26 connects the drain $D_3$ of each MOSFET M3 of each pixel in a row to the row reset supply voltage $V_{rst}$. The shared voltage $V_{rst}$, $V_{dd}$ is set to about 2.5V during the time each specific row is being processed and is otherwise disconnected when other rows are successively read out, reset and their reset noise adaptively nulled. In the embodiment shown in FIG. 1, $V_{rst}$ and $V_{dd}$ are shown as being applied at the same point, with buses 22, 26 connected together to maximize optical fill factor. Alternatively, buses 22 and 26 could be disconnected tom one another and separately connected to voltage sources $V_{dd}$, $V_{rst}$ as shown in copending U.S. patent application Ser. No. 09/081,541, filed May 19, 1998, incorporated by reference herein, to maximize dynamic range in processes having at least three metal levels.

Each transistor M1, M2, M3, M4 may be referred to as having three legs. For an MOS transistor, these legs correspond respectively to its source, gate and drain sides. Each transistor may be further referenced as having a control leg, which would correspond, for example, to the gate terminal of an MOS transistor or the base of a bipolar transistor.

The photodiode 12 may comprise a substrate diode, for example, with the silicide cleared. In such an embodiment, which is compatible with most CMOS processes, it is necessary to clear the silicide because it is opaque to visible light. Those skilled in the art will appreciate that each pixel 10 is designed in the simplest form to obtain the largest available light detecting area while providing broad spectral response, control of blooming and signal integration time, and compatibility with CMOS production processes.

For maximum compatibility with standard submicron CMOS processes, the photodiode 12 may be formed at the same time as the lightly doped drain (LDD) implant of n-type MOSFETs for the chosen process; this creates an n-on-p photodiode junction in the p-type substrate. Since no additional ion implantation is necessary, the process and wafer cost for the active-pixel circuit 10 are the same as those of standard, high volume digital electronic products.

Figure 3:
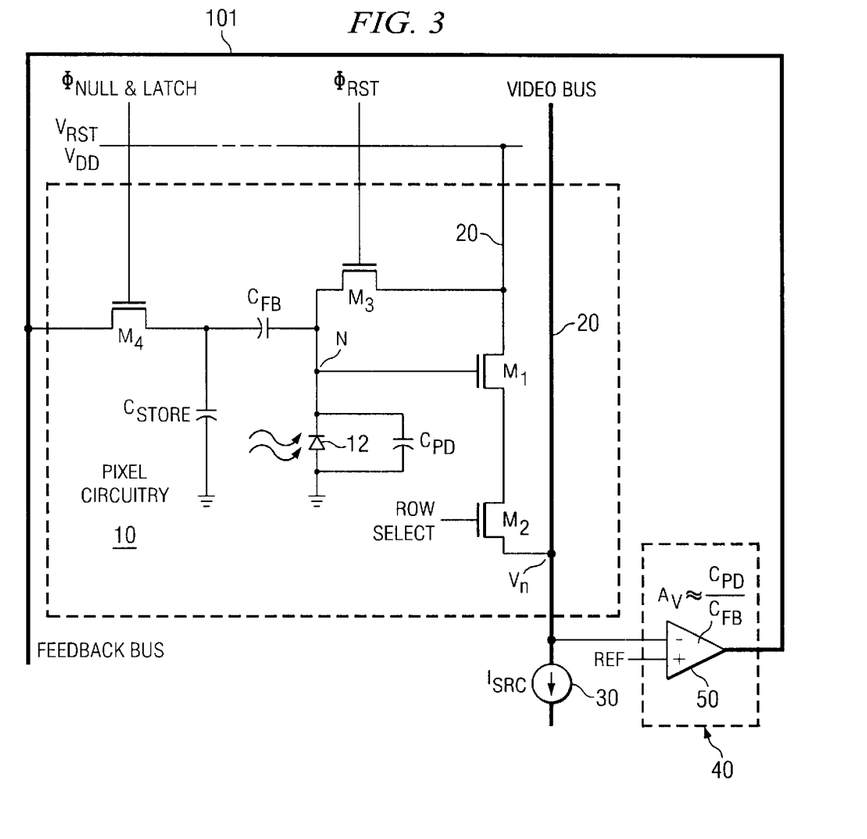
FIG. 3 is a schematic circuit diagram illustrating the low-noise active-pixel of the preferred embodiment during offset-nulling feedback.

FIG. 3 shows the active-pixel 10 configured in the offset-nulling mode. The signals from the photodetectors 12 are read out after a prescribed integration time one row at a time, from bottom to top of the array to accommodate lens-related image reversal. During signal integration for n-on-p photodetector polarity, the photodiode node N driving the gate of the source follower M1 discharges from the reset voltage, $V_{rst}$, to a lower voltage. The discharge rate depends directly upon the incident signal. Within each row, the photodetectors 12 are read out from left to right. In preparation for reading and resetting each row, $V_{rst}$ is set to about 2.5V. The upper leg of the first MOSFET M1 is connected via the row bus 22 to a low-impedance voltage source $V_{dd}$ to maximize dynamic range. Otherwise, to maximize optical fill factor, it is connected to $V_{rst}$. Readout then starts by turning on the access or "row select" MOSFETs M2 of all the photodetectors 12 in a selected row. The lower leg of the access MOSFET M2 thereby connects to a current source 30 servicing each column via bus 20. As noted, the first MOSFET M1 is a source follower driver that efficiently transfers the conditioned, photo-induced signal voltage source 30 servicing each column via bus 20. As noted, the first MOSFET M1 is a source follower driver that efficiently transfers the conditioned, photo-induced signal voltage from each row-selected photodiode 12 to the column bus 20. The transimpedance of the source follower amplifier is inversely proportional to the total capacitance at the gate of the first driver or MOSFET M1 including the detector and various strays.

The photodetectors 12 are reset one row at a time, from bottom to top of the array. Within each row, photodetectors 12 are read out from left to right. Reset starts by fully enabling the reset MOSFETs M3 in the selected row by setting the gate voltage to 3.3V via the $\Phi_{rst}$ clock, thereby connecting the low-impedance voltage source $V_{rst}$ to each photodiode 12 in a row. This clears the photo-induced charge from the photodiodes 12.

During the offset suppression epoch, a feedback amplifier 50 is first programmed to some multiple of the ratio of $C_{pd}$ to $C_{fb}$. In the preferred embodiment, the multiple used is approximately 2.5. Experiments have shown the preferred value to be in the range of approximately 2.5–3.0. During signal readout, on the other hand, the feedback amplifier 50 is otherwise programmed to a gain commensurate with the desired signal sensitivity needed for optimum imaging. The null and latch clock, $\Phi_{null\&latch}$, is next raised from ground to the supply voltage $V_{dd}$ to enable the fourth MOSFET M4 and close the feedback loop comprising the feedback bus 101 and the column buffer 40. The amplified pixel reset signal thus applies a voltage to the storage capacitance, $C_{store}$. Since the pixel 10 has just been reset and several microseconds have transpired to allow the output to settle, the signal voltage on $C_{store}$ is predominantly the amplified offset noise. The amplified offset applied to the storage capacitor $C_{store}$ subsequently capacitively couples, via the small coupling capacitor $C_{fb}$, to the integrating node of the photodiode 12 and its capacitance $C_{pd}$ with a linear attenuation that is roughly proportional to the ratio of $C_{fb}$ to $C_{pd}$. This linear attenuation normalizes the amplified offset signal to approximately unity and the resulting photodiode voltage is essentially devoid of reset noise.

The capacitor $C_{fb}$ is formed by suitably overlapping either the storage node N or an available interconnect layer to a photodiode interconnect layer. The capacitor $C_{store}$ is formed by a MOSFET capacitor that is preferably implemented by increasing the gate-to-diffusion overlap of the MOSFET M4 to achieve the desired capacitance. Since the photodiode capacitance will typically be on the order of $10^{-14}$ F for CMOS active-pixels in 5 to 8 $\mu$m pitch, the capacitor $C_{store}$ can be an order of magnitude smaller because the reset noise created by programming $C_{store}$ is attenuated by the ratio of $C_{fb}$ to $C_{pd}$. The linear attenuation within the pixel 10 hence reduces the requisite $C_{store}$ size by over an order of magnitude compared to the classic implementation of correlated doubled sampling. The capacitance $C_{fb}$ is chosen in practice to be on the order of 1 fF to provide roughly ten-fold linear attenuation. The preferred embodiment thus embodies the size-reducing advantage of simulating two capacitors and obviates using two discrete capacitors or other charge storage means.

Hence, just after each pixel 10 is reset, the feedback amplifier 50 servicing the pixel 10 nulls out the noise (both temporal and FPN), and the voltage on the storage capacitor $C_{store}$ is then latched. Upon readout, the "raw" video output is thus devoid of the reset noise stemming from the reset noise created by resetting the detector capacitance. The reset noise created by programming the storage capacitance $C_{store}$ is attenuated by about an order of magnitude to make it negligible. This technique does not suffer the bandwidth limitations of other feedback-based schemes and is therefore compatible with higher row reset rates for video rate imaging of large format imagers. Also, it does not require external memory.

Figure 4:
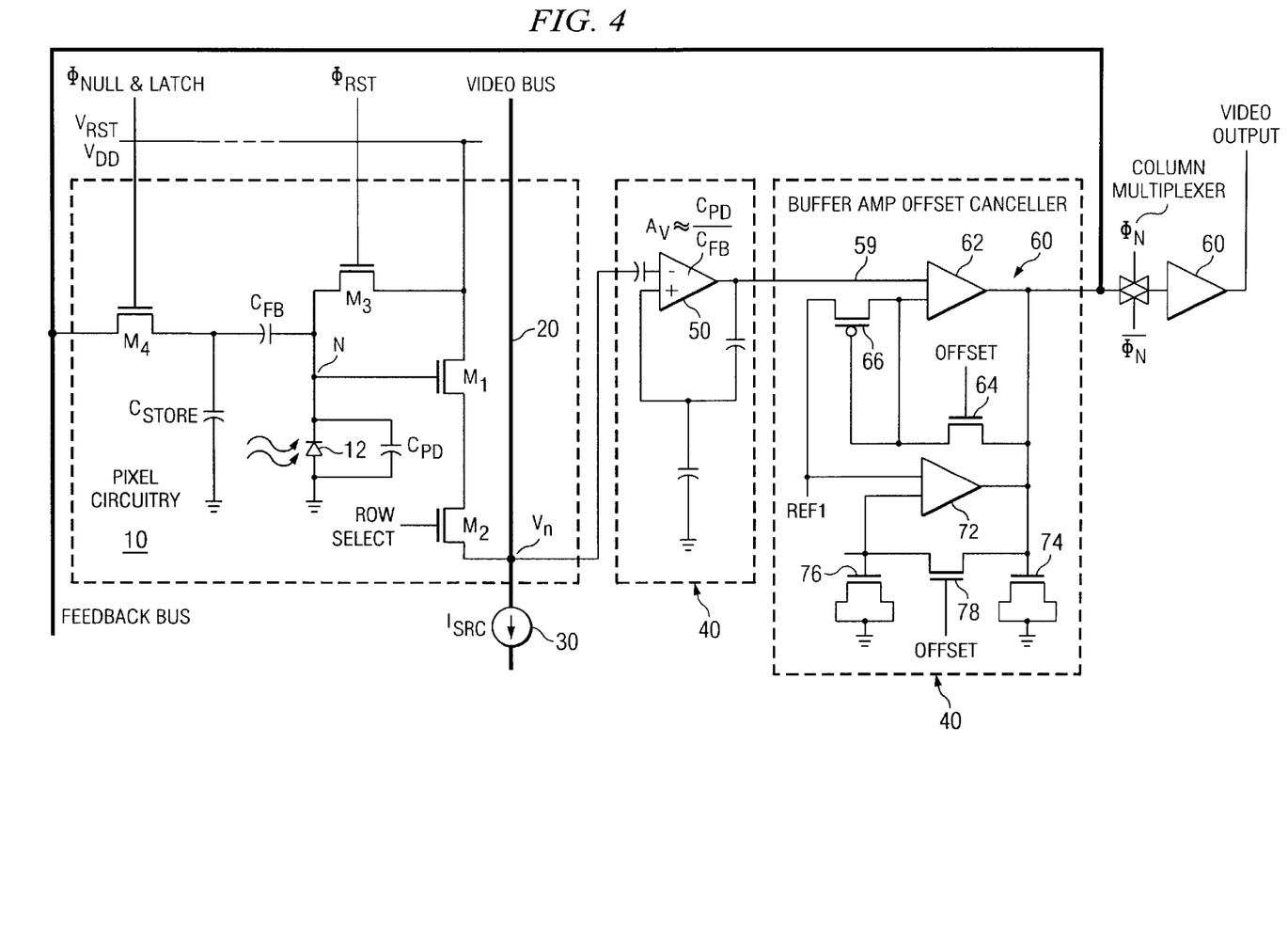
FIG. 4 is a schematic circuit diagram illustrating the low-noise active-pixel of an alternative embodiment of the present invention during offset-nulling feedback.

FIG. 4 shows a preferred embodiment for the feedback loop for servicing the active pixel 10, including the feedback bus 101 and the relevant portion of the column buffer 40 necessary to either feed back the appropriately amplified pixel signal to null the offset noise read, or to read the conditioned APS output signal with suitable gain to achieve the required sensitivity. In addition, the preferred embodiment includes an offset-canceled output buffer to further buffer the video signal.

According to the circuit of FIG. 4, an inverting amplifier 50 buffers the pixel signal $V_n$ with variable, programmable gain and drives an offset cancellation circuit 60. Programmability of the gain of the amplifier 50 is provided by incorporating several feedback capacitor combinations 61 to optimize optical sensitivity over a range of camera "f-stops".

The offset cancellation circuit 60 of FIG. 4 cancels offsets created by the amplifier 50. The amplifier 60 provides unity gain and includes a main amplifier 62 comprising a single stage, transconductor with a high output impedance connected to an output bus 61. A unity gain buffer is obtained by connecting the output 61 of the amplifier 62 to its inverting (−) input through a feedback connection offset switch 64, unhooking the reference voltage REF1 by means of a reference switch 66, and connecting the photo-generated signal supplied by the output 59 of the amplifier 50 to the noninverting (+) input of the amplifier 62. Threshold adjustment is obtained by placing a low transconductance amplifier 72 in parallel with the main amplifier 62. To cancel the offset, the amplifier 62 is put in a high gain mode by opening the feedback connection switch 64. The inverting (−) input to amplifier 72 is tied to the reference voltage REF1, and the output 61 is connected to a filter capacitor 74 and a sample capacitor 76 through an offset switch 78. In response, the amplifier 72 generates a current to cancel the unbalance current of the main amplifier 62. The correction voltage is trapped on the capacitor 76, and the main amplifier 62 is restored to its unity gain configuration. This technique of offset cancellation is further described in Degrauwe et al., "A Micropower CMOS-Instrumentation Amplifier," *IEEE Journal of Solid-State Circuits*, Vol. SC-20, No. 3, pp. 805–807 (June 1985).

Figure 5:
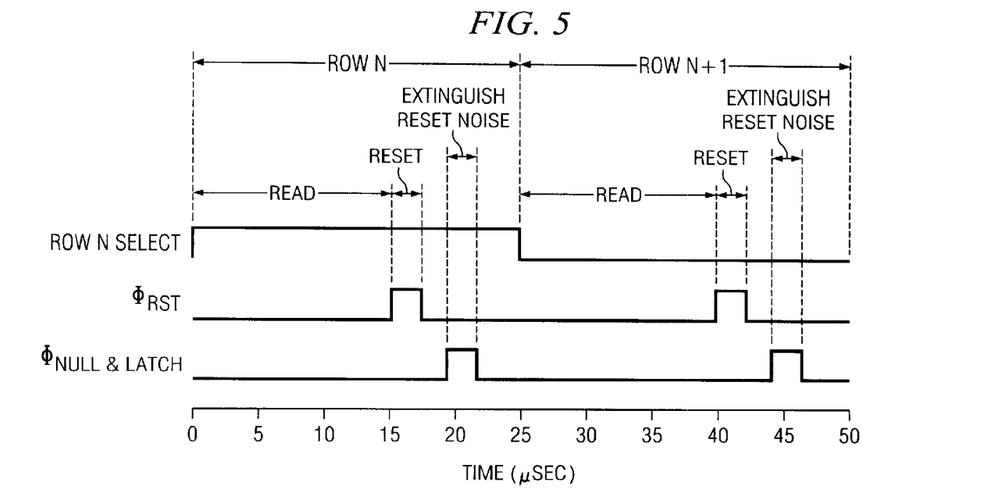
FIG. 5 shows a representative clocking diagram for the preferred embodiment.

FIG. 5 shows a representative clocking waveform pertaining to the circuitry of FIG. 3 to enable successively reading the pixel 10, resetting the pixel 10 and extinguishing the pixel's reset noise. In the basic timing diagram of FIG. 5, each row of the imager is processed over a line time of approximately 25 $\mu$sec. While much shorter line times are possible, the example is consistent with a 1024×768 imager operating at roughly a 60 Hz frame rate. During the 25 $\mu$sec interval when Row N is selected, each specific pixel 10 in the row N is read, reset and then the offset noise for each pixel in the row is canceled. Pixel Read is easily accommodated over the first 15 $\mu$sec of the line period. All of the pixels 10 in the row are then reset over about 2 $\mu$sec by strobing $\Phi_{rst}$ and allowing the pixels 10 to settle for an additional 2 $\mu$sec. The $\Phi_{null\&latch}$ clock is then strobed to close the feedback loop and extinguish the selected pixel's reset noise. Identical clock waveforms are then applied to all of the pixels of the next row (N+1).

Figure 6:
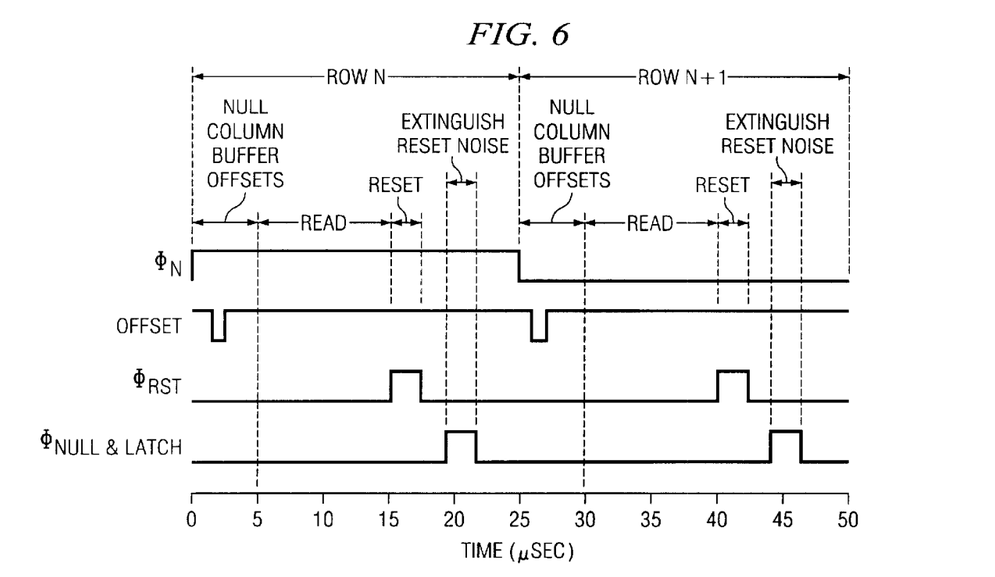
FIG. 6 shows a representative clocking diagram for the alternate embodiment.

The preferred embodiment of FIG. 4 requires the clocking shown in FIG. 6. In FIG. 6, the "Offset" clock is added to the basic waveform set previously described to facilitate operation of the offset cancellation circuit 60 of the column buffer 40. During the 25 $\mu$sec interval when Row N is selected via the enable clock $\Phi_N$, buffer offset cancellation is first accomplished so that each column buffer has negligible offset nonuniformity. Strobing the Offset clock first opens the feedback loop during the first several microseconds of the available row epoch to null the input offset nonuniformity to the order of 100 $\mu$V. The, feedback loop is then closed to subsequently provide output buffering at unity gain with negligible dc offset. All of the pixels 10 in a row are read, reset and then their offset noise is canceled. Pixel Read is easily accommodated over the first 15 $\mu$sec of the line period. The pixel is first reset for about 2 $\mu$sec by strobing $\Phi_{rst}$. It is then allowed to settle for about 2 $\mu$sec. The $\Phi_{null\&latch}$ clock is then strobed to close the pixel-column buffer feedback loop and extinguish the selected pixel's reset noise. Identical clock waveforms are then applied to the next row (N+1). Those skilled in the art will appreciate that the embodiment of FIGS. 4 and 6 reduces the various offsets including the reset noise and the threshold voltage offsets from the MOSFET M2 in each pixel because each photodetector 12 is independently nulled to cancel all pixel-to-pixel variations including those induced by substrate charge pumping.

In various preferred embodiments according to the present invention, the various clocks which together facilitate active-pixel reset, readout and offset noise elimination, are generated on-chip using standard CMOS digital logic and both column and row clocks. The digital logic thus enables "windowing" and various other region-of-interest functions including random access, wherein a user can read out the imager in various formats and locations simply by enabling the appropriate support logic to clock the appropriate subformat. With windowing, the 1032×776 format of the candidate embodiment can be read out as one or more arbitrarily sized and positioned M×N arrays without having to read out the entire array. For example, a user might desire to change a computer-compatible "VGA" format (i.e., approximately 640×480) to either Common Interface Format (CIF; nominally 352×240) or Quarter Common Interface Format (QCIF; nominally 176×120) without having to read out all the pixels in the entire array. This feature simplifies support electronics to reduce cost and match the needs of the particular communication medium. As an example, a personal teleconference link to a remote user having only QCIF capability could be optimized to provide QCIF resolution and thus reduce bandwidth requirements throughout the teleconference link while also subformat. With windowing, the 1032×776 format of the candidate embodiment can be read out as one or more arbitrarily sized and positioned M×N arrays without having to read out the entire array. For example, a user might desire to change a computer-compatible "VGA" format (i.e., approximately 640×480) to either Common Interface Format (CIF; nominally 352×240) or Quarter Common Interface Format (QCIF; nominally 176×120) without having to read out all the pixels in the entire array. This feature simplifies support electronics to reduce cost and match the needs of the particular communication medium. As an example, a personal teleconference link to a remote user having only QCIF capability could be optimized to provide QCIF resolution and thus reduce bandwidth requirements throughout the teleconference link while also reducing the imager power dissipation. As a further example, an imager configured in Common Interface Format (CIF) could provide full-CIF images while supplying windowed information for the portions of the image having the highest interest for signal processing and data compression. During teleconferencing the window around a person's mouth (for example) could be supplied more frequently than the entire CIF image. This scheme would reduce bandwidth requirements throughout the conference link.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An active pixel circuit having a photodetector, a source follower driver transistor, a row select transistor, a reset transistor, and a fourth transistor, the circuit comprising:

a first capacitor connected in parallel with the photodetector;

a second capacitor connected between the reset transistor and the fourth transistor; and a feedback amplifier connected between the row select transistor and the fourth transistor, wherein the gain of the amplifier equals a specified multiple of a reciprocal of a linear attenuation factor.

2. The circuit of claim 1, wherein the reciprocal of the linear attenuation factor is a ratio of the value of the first capacitor to the value of the second capacitor.

3. The circuit of claim 2, wherein the feedback amplifier reduces reset noise caused by resetting the photodetector.

4. The circuit of claim 3, further comprising a third capacitor connected between a node, formed by the fourth transistor and the second capacitor, and a circuit ground.

5. An active pixel sensor circuit comprising:

(a) a photodetector element having a node;

(b) a first transistor having a control leg connected to the node and second and third legs, the third leg being connected to a power supply voltage;

(c) a second transistor having a control leg and fourth and fifth legs, the fourth leg connected to the second leg of the first transistor;

(d) a third transistor having a control leg and sixth and seventh legs, the seventh leg being connected to a reset voltage source;

(e) a fourth transistor having a control leg and eighth and ninth legs;

(f) a first capacitance connected in parallel to the photodector; and (g) a second capacitance formed between the eighth leg and the sixth leg.

6. The apparatus of claim 5 further including an amplifier having an output connected to the ninth leg, the amplifier having a gain equal to a specified multiple of the ratio of the first capacitance to the second capacitance.

7. The circuit of claim 6, wherein the amplifier reduces reset noise caused by resetting the photodetector.

8. The apparatus of claim 7 wherein each of the first, second, third and fourth transistors comprises a MOSFET.

9. The apparatus of claim 8 wherein each the MOSFET is fabricated in CMOS.

10. The apparatus of claim 8 wherein the photodetector comprises a substrate diode with a silicide portion thereof removed.

11. The apparatus of claim 5 wherein the second capacitance comprises an overlapping portion of the node and an interconnect layer of the diode.

12. The apparatus of claim 5 wherein the second capacitance comprises a first interconnect layer overlapping a second interconnect layer.

13. The apparatus of claim 5 wherein the second interconnect layer is a photodiode interconnect layer.

14. The apparatus of claim 8 wherein the photodetector comprises an n on p photodiode junction in a p-type substrate.

15. The apparatus of claim 8 wherein the photodetector comprises a p on n photodiode junction in an n-type substrate.

16. The apparatus of claim 5 comprising a third capacitance formed between the eight leg and the sixth leg.

17. In an active pixel circuit including a photodetector, a source follower driver MOS transistor, a row select MOS transistor, a reset MOS transistor, a fourth MOS transistor, and first and second capacitances, the first capacitance connected in parallel to the photodetector, a method for reducing reset noise, the method comprising:

arranging the first and second capacitances to apply a ratio of the values thereof to a voltage on one of them;

reading out the voltage on the photodetector;

resetting the photodetector; and canceling reset noise created by resetting the photodetector by applying a gain which is a specified multiple of the inverse of the ratio to generate a noise cancellation signal for supply to the fourth transistor.

18. The method of claim 17 wherein the step of reading out the voltage on the photodetector includes the step of holding off the reset MOS transistor and turning on the row select MOS transistor.

19. The method of claim 18 wherein the step of resetting the photodetector comprises the step of fully enabling the reset MOS transistor.

20. The method of claim 18 wherein the step of reading out the voltage further includes the step of programming a feedback amplifier to a gain selected to provide desired signal sensitivity for optimum imaging.

21. The method of claim 17 wherein the step of canceling reset noise includes the step of setting a gain of a feedback amplifier equal to a specified multiple of the inverse of the ratio.

22. The method of claim 21 wherein the step of reading out the voltage further includes the step of programming the feedback amplifier to a gain selected to provide desired signal sensitivity for optimum imaging.

23. The method of claim 21 wherein the step of canceling the reset noise further comprises the step of enabling the fourth transistor to close a feedback loop to the first capacitance, the feedback loop including the feedback amplifier.

24. The method of claim 23 wherein the second capacitance supplies a normalizing signal to an integrating node of the photodiode.

25. The method of claim 24 further including the step of canceling offset created by the feedback amplifier.

26. In an imager pixel including a photodetector having a node and further having first, second, third and fourth transistors, a method of improving performance comprising:

creating a first capacitance in parallel with the photodetector;

creating a second capacitance in the pixel adjacent the node, the first and second capacitances having a ratio; and employing an amplifier having a gain which is a specified multiple of the ratio to cancel reset noise resulting from resetting the photodetector.

27. The method of claim 26 wherein the first, second, third and fourth transistors comprise MOS transistors.

28. An imager pixel comprising:

a photodetector;

a first capacitance connected in parallel to the photodetector;

a second capacitance adjacent the photodetector and connected so as to supply a voltage on the first capacitance to the photodetector while multiplying that voltage by the ratio of the second capacitance to the first capacitance;

a first transistor means for functioning as the driver of a source follower amplifier during signal readout;

second transistor means for controlling signal readout;

third transistor means for serving as a reset switch; and a fourth transistor means for transferring a voltage to the first capacitance.

29. The imager pixel of claim 28 and further including a feedback circuit for generating the voltage.

30. The invention of claim 29 wherein the feedback circuit includes an amplifier having a gain which is a specified multiple of the ratio.

* * * * *